United States Patent [19]

Nakamura

[11] Patent Number: 5,764,528
[45] Date of Patent: Jun. 9, 1998

[54] DELAY OPTIMIZING METHOD IN LOGIC CIRCUIT DESIGNING

[75] Inventor: Atsushi Nakamura, Tokyo, Japan

[73] Assignee: NEC Corporation, Tokyo, Japan

[21] Appl. No.: 670,128

[22] Filed: Jun. 25, 1996

[30] Foreign Application Priority Data

Jun. 26, 1995 [JP] Japan .................................. 7-159465

[51] Int. Cl.$^6$ ................................................. G06F 17/50
[52] U.S. Cl. ........................................... 364/489; 364/488
[58] Field of Search ................................. 364/488, 489, 364/490, 491, 578

[56] References Cited

U.S. PATENT DOCUMENTS

| | | | |
|---|---|---|---|
| 5,210,700 | 5/1993 | Tom | 364/489 |
| 5,396,435 | 3/1995 | Ginetti | 364/489 |
| 5,410,491 | 4/1995 | Minami | 364/491 |
| 5,416,718 | 5/1995 | Yamazaki | 364/488 Q |
| 5,557,779 | 9/1996 | Minami | 395/500 |
| 5,638,291 | 6/1997 | Li et al. | 364/490 |

OTHER PUBLICATIONS

Shenoy et al., "Minimum Padding to Satisfy Short Path Constraints", pp. 156–161, (1993).

Primary Examiner—Emanuel Todd Voeltz
Assistant Examiner—Leigh Garbowski
Attorney, Agent, or Firm—Foley & Lardner

[57] ABSTRACT

A delay optimizing method including a first step of detecting a signal path violating minimum delay constraints, a second step of calculating the frequency of overlap of each output terminal included in a synchronous sequential circuit with signal paths violating the minimum delay constraints, and a third step of inserting a level latch into a signal path in a descending order of the frequency of overlap with signal paths violating minimum delay constraints so as to have a minimum LSI layout pattern area of the synchronous sequential circuit.

11 Claims, 16 Drawing Sheets

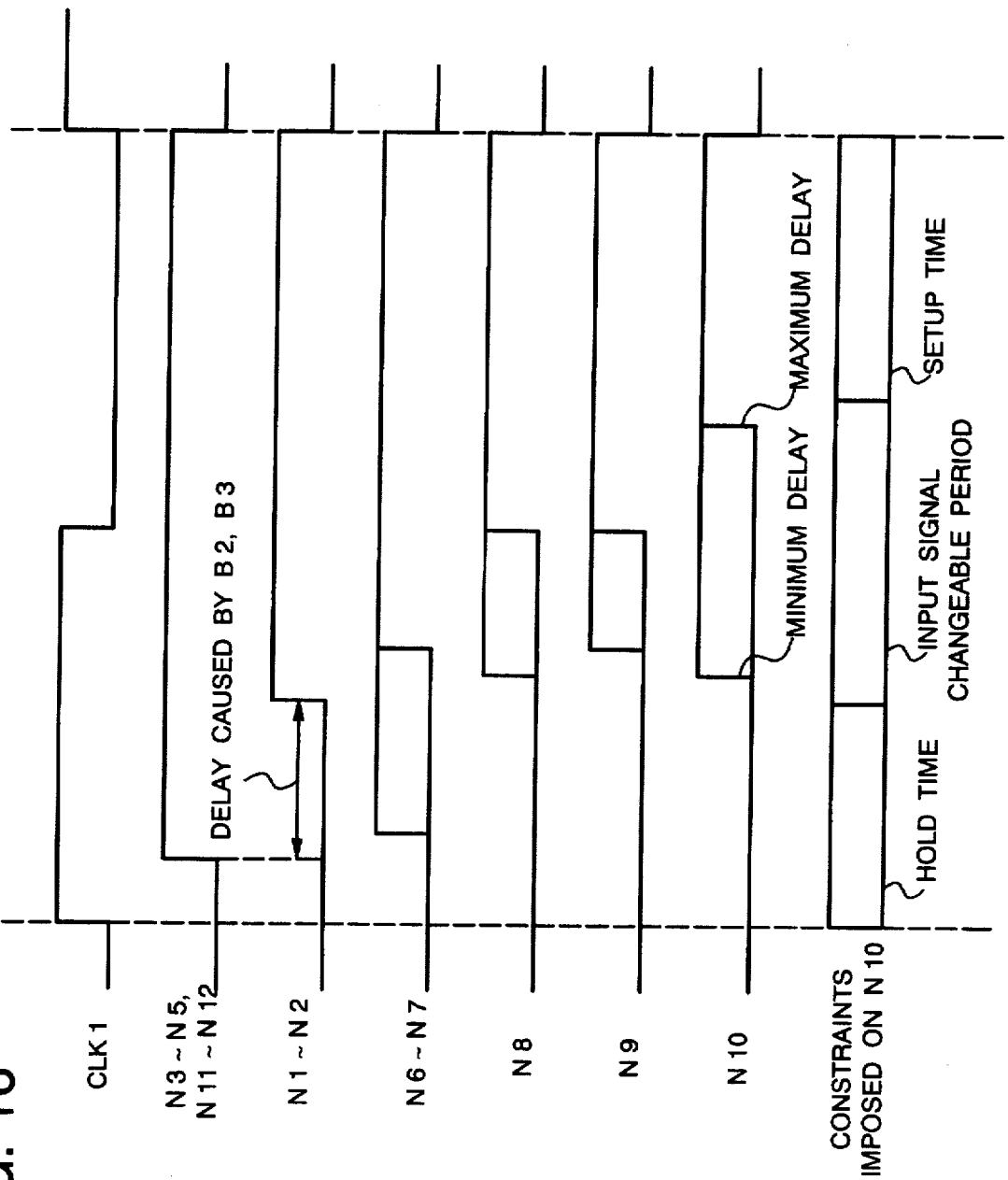

DELAY OPTIMIZING METHOD IN LOGIC CIRCUIT DESIGNING

BACKGROUND OF THE INVENTION

1. Field of the Invention

The present invention relates to a delay optimizing method to be executed for obtaining appropriate delays when in designing a logic circuit by a logic synthesis device and, more particularly, to a delay optimizing method to be employed for compensating for required minimum delay constraints.

2. Description of the Related Art

First, description will be given to the significance of compensation for minimum delays. In a D-type flip-flop (hereinafter referred to as DFF), for example, a signal value of a data input terminal is read at the instance of a rise (or fall) of a clock and propagated to an output terminal. At this time, a correct signal value can not be propagated until an input signal is fixed to a stable state for a fixed time period before and after the time point of a rise (or fall) of the clock. Such time constraints as a setup time (a fixed time period before a time point of a clock rise (or fall)) and a hold time (a fixed time period after a time point of a clock rise (or fall)) are therefore imposed on the data input terminal of the DFF to inhibit the input signal from changing within these time periods.

In general, in a synchronous sequential circuit including a storage element, for example, a DFF, there exists a signal path (hereinafter referred to as a path) composed of combinational logic elements which start with an output terminal of a predetermined DFF or an external input terminal and end with a data input terminal of other DFF. When combinational logic elements on a path have a plurality of input terminals, signals arrive at the respective input terminals at different times (arrival time) because they have passed through different paths to reach the terminals. The output value of the combinational logic element starts changing to be indefinite at the time point of the arrival of the first input signal and is defined at the time when the last signal arrives. This time point at which the signal value starts changing is called minimum arrival time or minimum delay, while the time point at which the signal value is defined is called maximum arrival time or maximum delay. There is a case, however, where a certain combination between an input signal value and its directly preceding output signal value causes no change in an output signal value.

Assuming a one-phase synchronous sequential circuit, maximum/minimum delays propagate on a path and minimum and maximum delays exist also at a data input terminal of an DFF, which is an end terminal of the path. For the synchronous sequential circuit to operate properly, the minimum delay at the data input terminal of the DFF should be larger than a hold time (minimum required time) and the maximum delay should be smaller than a time obtained by subtracting a setup time from a clock cycle (maximum required time). Constraints of the former delay time are minimum delay constraints, while those of the latter are maximum delay constraints.

The minimum/maximum required time at an input terminal of a DFF located at the end of a path can be obtained by conducting calculation of circuit delays and reverse calculation on the path in the direction opposite to the signal propagation direction. It is possible to calculate and set minimum/maximum required time with respect to each output terminal (hereinafter referred to as net) of all the combinational logic elements on the path.

Minimum/maximum delay constraints should be satisfied at every net. With the arrival time of a maximum delay of the net "i" represented as A(i), the arrival time of a minimum delay as a(i), the required time of the maximum delay as R(1) and the required time of the minimum delay as r(i), the following expression should hold.

$$A(i)<R(i) \text{ and } r(i)<a(i) \tag{1}$$

As compensation processing for satisfying hold time constraints (hereinafter referred to as minimum delay compensation) of flip-flops constituting a synchronous sequential circuit, there is a conventional method of providing delay buffers in a synchronous sequential circuit. The conventional method will be described with reference to FIGS. 12 to 16.

FIG. 12 is a circuit diagram showing an example of a synchronous sequential circuit including a path violating minimum delay constraints and FIG. 13 is a timing chart showing operation of the synchronous sequential circuit shown in FIG. 12. FIG. 14 is a flow chart showing a conventional delay optimizing method. FIG. 15 is a circuit diagram showing an example of a synchronous sequential circuit to which the conventional delay optimizing method is applied and FIG. 16 is a timing chart showing operation of the synchronous sequential circuit illustrated in FIG. 15.

In FIG. 12, F1–F7 are DFFs which are triggered at a rise of the clock to accept and hold input data. A CLK1 is a clock input terminal, G1–G5 are combinational logic elements and N1–N12 are nets. There exist the following eight paths from F1–F5 to N10.

$$F1 - N1 - G5 - N10$$
$$F2 - N2 - G3 - N9 - G5 - N10$$
$$F3 - N3 - G1 - N6 - G3 - N8 - G5 - N10$$
$$F3 - N3 - G1 - N6 - G4 - N9 - G5 - N10$$
$$F4 - N4 - G1 - N6 - G3 - N8 - G5 - N10$$
$$F4 - N4 - G1 - N6 - G4 - N9 - G5 - N10$$
$$F4 - N4 - G2 - N7 - G4 - N9 - G5 - N10$$
$$F5 - N5 - G2 - N7 - G4 - N9 - G5 - N10$$

It is assumed here that arrival times of the signals which have passed the two paths F1-N1-G5-N10 and F2-N2-G3-N9-G5-N10 violate the minimum delay constraints imposed on N10.

The arrival time of the maximum delay of the net "1" will be expressed as A(1), the arrival time of the minimum delay as a(i), the required time of the maximum delay as R(i) and the required time of the minimum delay as r(i). When a delay buffer with a delay of "d" is inserted in a route of the net "i", both the maximum delay and the minimum delay are increased by "d". For the circuit in which the delay buffer is inserted to satisfy the expression (1), therefore, the buffer is only allowed to be inserted into a net for which the following expressions hold.

A(i)+d<R(i) and r(i)<a(i)+d, which is combined into one expression: (A(i)+d)-r(i)<R (i)-(a(i)+d), that is, $$A(i)-a(i)<R(i)-r(i) \text{ or}$$
$$r(i)-a(i)<R(i)-A(i) \tag{2}$$

This is because inserting a delay buffer so as to satisfy the minimum delay constraints into a net for which the expression (2) fails to hold will result in the maximum delay constraints being violated without fail.

In the expression (2), r(i)-a(i) denotes a minimum slack, while R(i)-A(i) denotes a maximum slack.

The flow chart of FIG. 14 shows an example of a conventional minimum delay compensation method by the insertion of delay elements or buffers. The illustrated method is realized by adding heuristics for saving areas to the method disclosed as a basic method in the literature "Minimum Padding to Satisfy Short Path Constraints" (N. V. Shenoy, R. K. Brayton, A. L. Sangiovanni-Vincentelli, ICCAD93, p.156–161, IEEE, 1993).

The processing method illustrated by the flow chart is targeted at one-phase synchronous sequential circuit and based on the assumption that optimization of the maximum delay is already completed to satisfy the setup time constraints (maximum delay constraints).

First, maximum delay is calculated to write a maximum slack on each net on a path (Step 1401). Then, minimum delay is calculated to write a minimum slack on each net on the path and a list of minimum delay violating paths is held in a storage unit (1402). Here, if there is no minimum delay violating path, processing is completed (Step 1403). If there is, calculation of a delay buffer insertion position and insertion of a delay buffer are conducted (Steps 1403, 1404). Then, a set of nets included in a minimum delay violating path is selected to be a set S1 (Step 1405). Next, out of the set S1, nets whose maximum slack and minimum slack satisfy the above-described expression (2) are selected to be a set S2 (Step 1406). Here, if the set S2 is empty, the set S1 is taken as the set S2 (Step 1407). Next, nets whose frequency of overlap with minimum delay violating paths is high are selected among the set S2 and taken as a set S3 (Step 1408). Then, a delay buffer is inserted into one net selected from the set S3 to return to Step 1401 (Step 1409).

FIG. 15 shows a synchronous sequential circuit obtained by executing the above-described conventional delay optimizing method with respect to the circuit illustrated in FIG. 12. Here, an area of one delay buffer is regarded as 2 units. Inserted are six delay buffers and the increase in area will be accordingly 12 units. FIG. 16 is a timing chart of the circuit illustrated in FIG. 15. With reference to FIG. 16, it can be found that the maximum delay at a data input terminal of a DFF remains the same and only the minimum delay is increased, and all the delay constraints are satisfied.

The above-described conventional minimum delay compensation method by inserting delay buffers into a synchronous sequential circuit needs detailed calculation of both maximum and minimum delays in order to calculate an optimum insertion position that will minimize effects on the maximum delay and make a circuit area smallest. The conventional method therefore has a drawback that calculation processing requires a lot of time.

On the other hand, in a multi-input combinational logic elements such as combined logic gates and multiplexers, when there are numbers of input terminals at which signals arrive too early and a net of an output terminal fails to satisfy the expression (2), delay buffers should be inserted individually into all the nets of the input terminals at which signals arrive too early. As a result, a larger number of the insertion positions and increased circuit area is accordingly required.

Furthermore, there is a case where a user sets a larger margin of a hold time in consideration of the effects of clock skew. Delay buffer insertion therefore has a drawback that a plurality of delay buffers need to be inserted in series in proportion to a length of a hold time, which involves considerable increase in circuit area.

SUMMARY OF THE INVENTION

A first object of the present invention is to provide a delay optimizing method which realizes minimum delay compensation, without affecting a maximum delay time, by using a level latch as a delay element.

A second object of the present invention, in addition to the above first object, is to provide a delay optimizing method which enables reduction of a calculation processing time by conducting only minimum delay calculation without giving no particular consideration to the maximum delay after maximum delay calculation is first conducted.

A third object of the present invention, in addition to the above-described first object, is to provide a delay optimizing method which avoids such a situation that insertion of a delay element into a circuit needs addition of certain processing to other part of the circuit, thereby minimizing an increase in an LSI layout pattern area.

A fourth object of the present invention is to provide a delay optimizing method by which, even when a user sets a larger margin of a hold time, delay constraints can be satisfied within a latch period of a level latch as long as one level latch is inserted in a path.

A fifth object of the present invention is to provide a delay optimizing method which enables minimum delay compensation with respect to not a one-phase, but a multi-phase synchronous sequential circuit by generating a clock signal whose phase or duty ration is converted, from a clock supplied to a DFF which terminates a path where a level latch is inserted and supplying the clock signal to the level latch.

A sixth object of the present invention is to provide a delay optimizing method by which minimum delay compensation is conducted by using a delay buffer for a part where insertion of a level latch is a problem because a hold time or a setup time of the level latch itself is not negligible.

A seventh object of the present invention is to provide a delay optimizing method which copes with a maximum delay required time longer than a latch time of a level latch by changing a duty ratio of a clock.

An eighth object of the present invention is to provide a delay optimizing method by which increases in a circuit area when a level latch is inserted and when a delay buffer is inserted are calculated in advance to automatically and selectively conduct either delay optimization method involving a less increase of a circuit area.

According to one aspect of the invention, a delay optimizing method characterized in that a delay time is added to a signal path which is short in delay time to violate minimum delay constraints in a synchronous sequential circuit so as to compensate for a minimum delay: comprising the steps of:

a first step of detecting a signal path violating said minimum delay constraints, a second step of calculating the frequency of overlap of each output terminal included in said synchronous sequential circuit with signal paths violating the minimum delay constraints, and a third step of inserting a level latch in a signal path in the descending order of said frequency of overlap such that an LSI layout pattern area of said synchronous sequential circuit is minimized.

In the preferred construction, the third step of inserting a level latch into a signal path includes a step of inserting an active-low level latch into a flip-flop which accepts input data at a rise of the clock and an active-high level latch into a flip-flop which accepts input data at a fall of the clock according to the edge trigger polarity of the clock in a flip-flop in said synchronous sequential circuit.

In another preferred construction, the third step of inserting a level latch into a signal path includes a step of inserting a level latch into a signal path in the descending order of said frequency of overlap, out of the signal paths in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below:

$$TL+TT<R(i)$$

The third step of inserting a level latch in a signal path may include a step of adding a circuit for changing a duty ratio of a clock to be supplied to said inserted level latch when a minimum delay required time is longer than a latch period.

According to another aspect of the invention, a delay optimizing method characterized in that a delay time is added to a signal path which is short in delay time to violate minimum delay constraints in a synchronous sequential circuit so as to compensate for a minimum delay, comprising the steps of:

a first step of detecting a signal path violating said minimum delay constraints, a second step of calculating the frequency of overlap of each output terminal included in said synchronous sequential circuit with signal paths violating the minimum delay constraints, and a third step of selectively inserting a delay buffer or a level latch as a delay element into a signal path in the descending order of said frequency of overlap such that an LSI layout pattern area of said synchronous sequential circuit is minimized.

In the above-mentioned construction, the third step of inserting a level latch in a signal path includes a step of inserting an active-low level latch into a flip-flop which accepts input data at a rise of the clock and an active-high level latch into a flip-flop which accepts input data at a fall of the clock according to the edge trigger polarity of the clock in a flip-flop in said synchronous sequential circuit.

In this case, the third step of inserting a level latch into a signal path includes a step of inserting a level latch into a signal path in the descending order of said frequency of overlap, out of the signal paths in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below:

$$TL+TT<R(i)$$

Preferably, the third step of inserting a level latch into a signal path includes the steps of:

a fourth step of selecting a signal path in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below;

$$TL+TT<R(i), \text{ and}$$

a fifth step of comparing a maximum delay and a maximum required time of a signal path selected by said fourth step, inserting a level latch into a signal path in the descending order of said frequency of overlap when the maximum delay is smaller and otherwise inserting a delay buffer into the signal path.

The third step of inserting a level latch into a signal path may include a step of comparing, with respect to signal paths into which said delay element is to be inserted, an increase in area of a circuit as a whole in a case where a delay buffer is inserted and an increase in area of a circuit as a whole in a case where a level latch is inserted and inserting a delay buffer into the signal path when the circuit area increase by the insertion of a delay buffer is smaller and a level latch into the signal path when the circuit area increase by the insertion of a level latch is smaller.

Other objects, features and effects of the present invention will become apparent from the detailed description in the following.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 16 is a timing chart showing operation of the synchronous sequential circuit illustrated in FIG. 15.

DESCRIPTION OF THE PREFERRED EMBODIMENTS

Preferred embodiments of the present invention will be descried in detail with reference to the accompanying drawings.

(First Embodiment)

Figure 1:
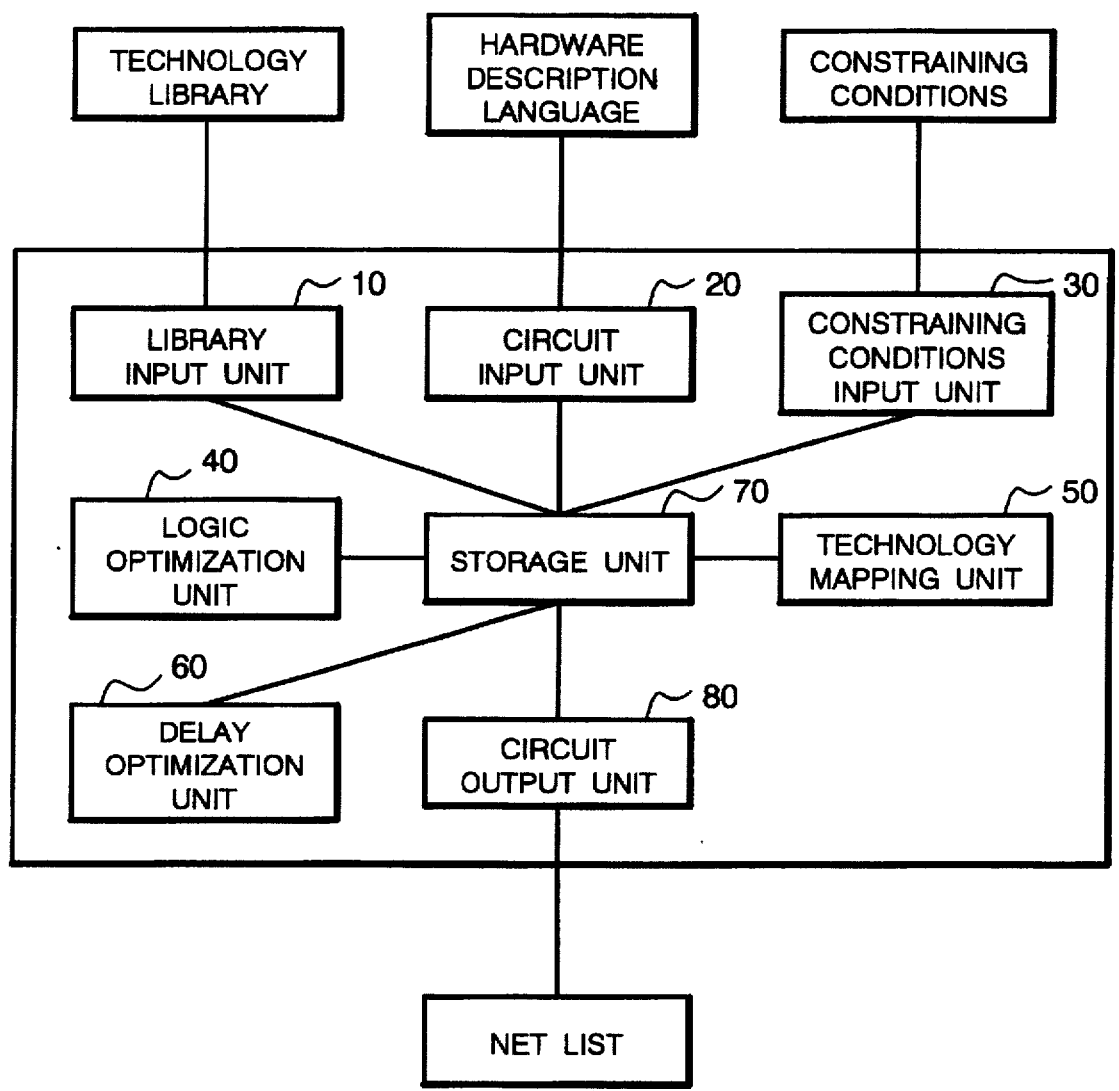
FIG. 1 is a block diagram showing a structure of a logic synthesis device which implements a delay optimizing method according to the present invention.
Figure 2:
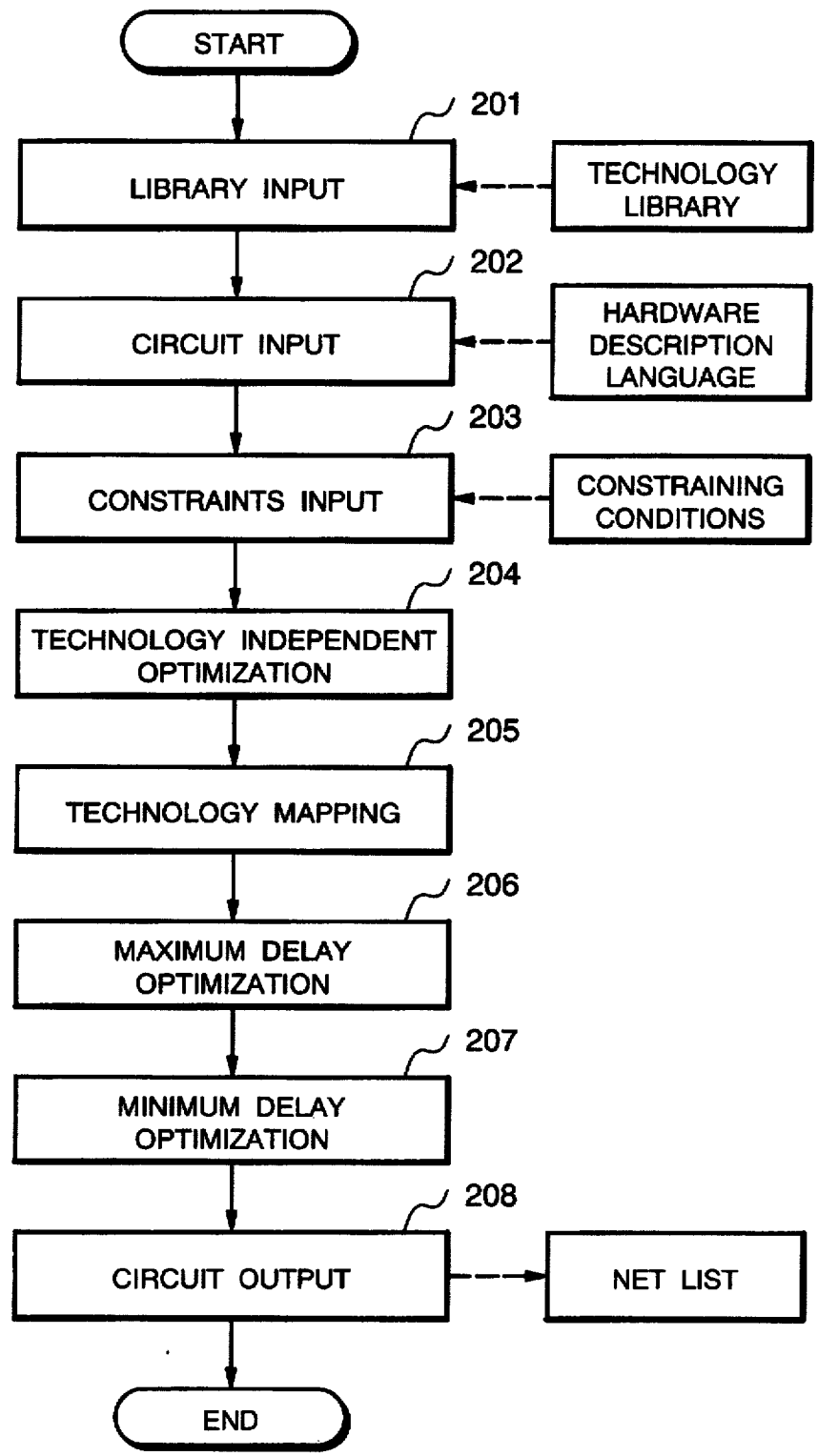
FIG. 2 is a flow chart showing operation of logic synthesis processing by the logic synthesis device of FIG. 1.

First, description will be made of a logic synthesis device which implements a delay optimization method according to a first embodiment of the present invention and operation of the entire logic synthesis processing. FIG. 1 is a block diagram showing a structure of a logic synthesis device which implements the present embodiment, while FIG. 2 is a flow chart showing operation of the logic synthesis device illustrated in FIG. 1.

As illustrated in FIG. 1, the logic synthesis device for use in the present embodiment, which is implemented by a CAD system using a computer or the like, includes a library input unit 10 for receiving input of technology library block information for use in technology mapping of a synchronous sequential circuit, a circuit input unit 20 for reading a synchronous sequential circuit as a target of logic synthesis processing, a constraining conditions input unit 30 for reading constraining conditions for designing a synchronous sequential circuit, a logic optimization unit 40 for optimizing logic of a logic synthesis circuit (hereinafter suitably referred to as a target circuit) which is a read processing target, a technology mapping unit 50 for allocating a technology library block to a target circuit, a delay optimization unit 60 for conducting delay optimization of a synchronous sequential circuit as a target circuit for the purpose of satisfying delay constraints specified as constraining conditions, a storage unit 70 for holding a technology library, a synchronous sequential circuit and constraining conditions, and a circuit output unit 80 for outputting a synchronous sequential circuit as a logic synthesis result.

The library input unit 10, which is implemented by a program-controlled CPU or the like, receives, through library input processing, input of a technology library in which such information as logic and delay values of a technology library block are described and stores the library in the storage unit 70.

The circuit input unit 20, which is implemented by a program-controlled CPU or the like, receives input of hardware description language (hereinafter referred to as HDL) of a circuit (target circuit) as a target of logic synthesis processing through circuit input processing and stores the HDL in the storage unit 70.

The constraining conditions input unit 30, which is implemented by a program-controlled CPU or the like, receives input of constraining conditions imposed on the HDL which are applied to the circuit input unit 20 through constraining conditions input processing and stores the constraining conditions in the storage unit 70. Constraining conditions include time constraints such as maximum delay constraints based on setup and minimum delay constraints based on hold and constraints imposed on an LSI layout pattern area.

The logic optimization unit 40, which is implemented by a program-controlled CPU or the like, conducts logic optimization independent of a technology library block with respect to the HDL stored in the storage unit 70 through technology independent optimization processing.

The technology mapping unit 50, which is implemented by a program-controlled CPU or the like, allocates a technology library block to the HDL stored in the storage unit 70 through technology mapping processing which aims at satisfying constraining conditions imposed on the area of the LSI layout pattern which are stored in the storage unit 70.

The delay optimization unit 60, which is implemented by a program-controlled CPU or the like, conducts delay optimization, through technology independent optimization processing, independent of a technology library block which aims at satisfying the constraining conditions regarding delays stored in the storage unit 70. After the execution of the technology mapping processing by the technology mapping unit 50, the unit 60 also conducts maximum delay optimization processing and minimum delay optimization processing dependent on the technology library block which aims at satisfying the constraining conditions regarding delays held in the storage unit 70. The present embodiment is characterized by the minimum delay optimization processing by the delay optimization unit 60. Operation of the delay optimization unit 60 will be described in detail later.

The storage unit 70, which is implemented by a storage device such as a memory including a RAM or a magnetic disk device, stores and holds the technology library, HDL and constraining conditions as described above to provide held information for use in the processing by the logic optimization unit 40, the technology mapping unit 50 and the delay optimization unit 60. The storage unit 70 also stores a net list as the results of logic synthesis processing by each unit.

The circuit output unit 80, which is implemented by a program-controlled CPU or the like, outputs a net list subjected to the above-described respective processing and held in the storage unit 70 through circuit output processing.

The entire operation of the logic synthesis processing by thus structured logic synthesis device will be described with reference to the flow chart of FIG. 2.

First, the library input unit 10 executes library input processing to receive input of a technology library where such information as logic and delay values of a technology library block are described (Step 201). The circuit input unit 20 executes circuit input processing to receive input of HDL (Step 202). The constraining conditions input unit 30 executes constraints input processing to receive input of constraining conditions imposed on the HDL (Step 203). These input information are stored and held in the storage unit 70.

Next, the logic optimization unit 40 and the delay optimization unit 60 execute technology independent optimization processing with respect to the HDL held in the storage unit 70 to conduct logic optimization and delay optimization independent of the technology library block (Step 204).

Then, the technology mapping unit 50 executes technology mapping processing to allocate a technology library block to the HDL held in the storage unit 70 (Step 205).

The delay optimization unit 60 then executes maximum delay optimization processing with respect to the circuit held in the storage unit 70 to conduct maximum delay optimization in a state dependent on the technology library block (Step 206). The unit 60 executes minimum delay optimization processing as well to conduct minimum delay optimization in a state dependent on the technology library block (Step 207).

Lastly, the circuit output unit 80 executes circuit output processing to output a net list as the results of logic synthesis processing held in the storage unit 70 (Step 208).

In the following, description will be made of the minimum delay optimization processing by the delay optimization unit 60 which is characteristic of the present embodiment. In the delay optimizing method according to the present embodiment, a delay time is added to such a signal path as violates the minimum delay constraints input to the constraining conditions input unit 30 and is short in delay time so as to compensate the path for minimum delay, out of the signal paths in the synchronous sequential circuit input to the circuit input unit 20.

In this embodiment, the delay optimization unit 60 inserts a level latch in a signal path violating minimum delay constraints. Operation for inserting this level latch includes a step of calculating the frequency of overlap of each output terminal included in a synchronous sequential circuit with a signal path violating the minimum delay constraints and a step of inserting a level latch into a signal path in a descending order of frequency of overlap such that an LSI layout pattern area of the synchronous sequential circuit is minimized.

First, description will be given of the fact that insertion of a level latch in a net violating the minimum delay constraints enables minimum delay compensation. It is assumed here that inserting a level latch in a net is to insert a level latch between an output terminal of a certain element and a net, connect the output terminal of the element and a data input terminal of the level latch with another net and connect the output terminal of the level latch and the original net.

In a case of a one-phase synchronous sequential circuit using a DFF to be triggered at a rise of the clock, consideration will be given to the insertion of such a level latch (active-low) into a net "i" as will enter a state to allow an input signal value to be directly output when the clock is at a low level, for supplying the clock of the same waveform as that of the clock supplied to the DFF also to the level latch. With a DFF to be triggered at a fall of the clock, such a level latch (active-high) is inserted as enters a state to allow an input signal value to be directly output when the clock is at a high level.

The minimum arrival time of the net "i" before a level latch is inserted is represented as a(i), the maximum arrival time as A(i), the minimum required time as r(i) and the maximum required time as R(i), while a time period when the level latch is being latched, that is, a time period when the clock is at a high level, is represented as TL and a time period when the level latch is at a state to allow an input signal value to be output (active state), that is, a time period when the clock is at a low level, as TA. A time required for a signal to pass through the level latch is represented as TT. In general, the time TT is short enough as compared with the time TL. It is further assumed that a setup time TS and a hold time TH of the level latch itself are short enough as compared with those of the DFF.

The minimum delay of the net "1" after the level latch is inserted will be expressed as max (a(i), TL+TT) and the maximum delay as max (A(i), TL+TT).

The minimum delay constraints of the net "i" after the insertion of the level latch will be expressed as:

$$r(i) < max(a(i), TL+TT) \quad (3)$$

On the other hand, in an ordinary circuit design, when a duty ratio of the clock is 50 percent or so, the following expression always holds.

$$r(i) < TL$$

As a result, the expression (3) always holds to compensate for the minimum delay.

The maximum delay constraints of the net "i" after the insertion will be expressed as:

$$max (A(i)+TT, TL+TT) < R(i) \quad (4)$$

In a case of a circuit in which optimization of the maximum delay is already conducted and the maximum delay constraints are already satisfied with a margin of the time TT or so, since the expression $$A(i)+TT < R(i)$$

holds before the insertion of the level latch, even if the level latch is inserted into a net for which the following expression holds, $$TL+TT < R(i) \quad (5)$$

the expression (4) will be satisfied to cause no violation of the maximum delay constraints. As described in the foregoing, it is theoretically possible to compensate such a net as violating the expression (4) for the minimum delay through the insertion of a latch due to the foregoing reasons.

When a setup time and a hold time of a level latch itself are too long to be ignored as compared with those of the DFF, insertion of the level latch into a net which violates the hold time of the DFF might result in violation of the hold time of the level latch itself. It is therefore necessary to beforehand supply the level latch with a clock whose phase is advanced of the clock supplied to the DFF by the hold time of the level latch to make the end of the hold time of the level latch coincide with the trigger (rise) time of the clock of the DFF.

With the clock cycle "T", the maximum required time of the data input terminal of the level latch inserted into the net "i" will be expressed as:

min (the maximum required time calculated from the level latch, the maximum required time calculated from DFF)

=min (T-TH-TS, R(i)-TT), so that the level latch can be inserted only in a net (i) whose maximum arrival time A(i) before the insertion of the level latch will satisfy the following expression.

$$A(i) < min (T-TH-TS, R(i)-TT) \quad (6)$$

When the setup time and the hold time of the level latch itself are too long to be ignored, it is therefore impossible to compensate a minimum delay violating path in which there exists no net satisfying both the expressions (5) and (6) at the same time for minimum delay by the insertion of a level latch. Insertion of a conventional delay buffer is needed in combination.

Figure 3:
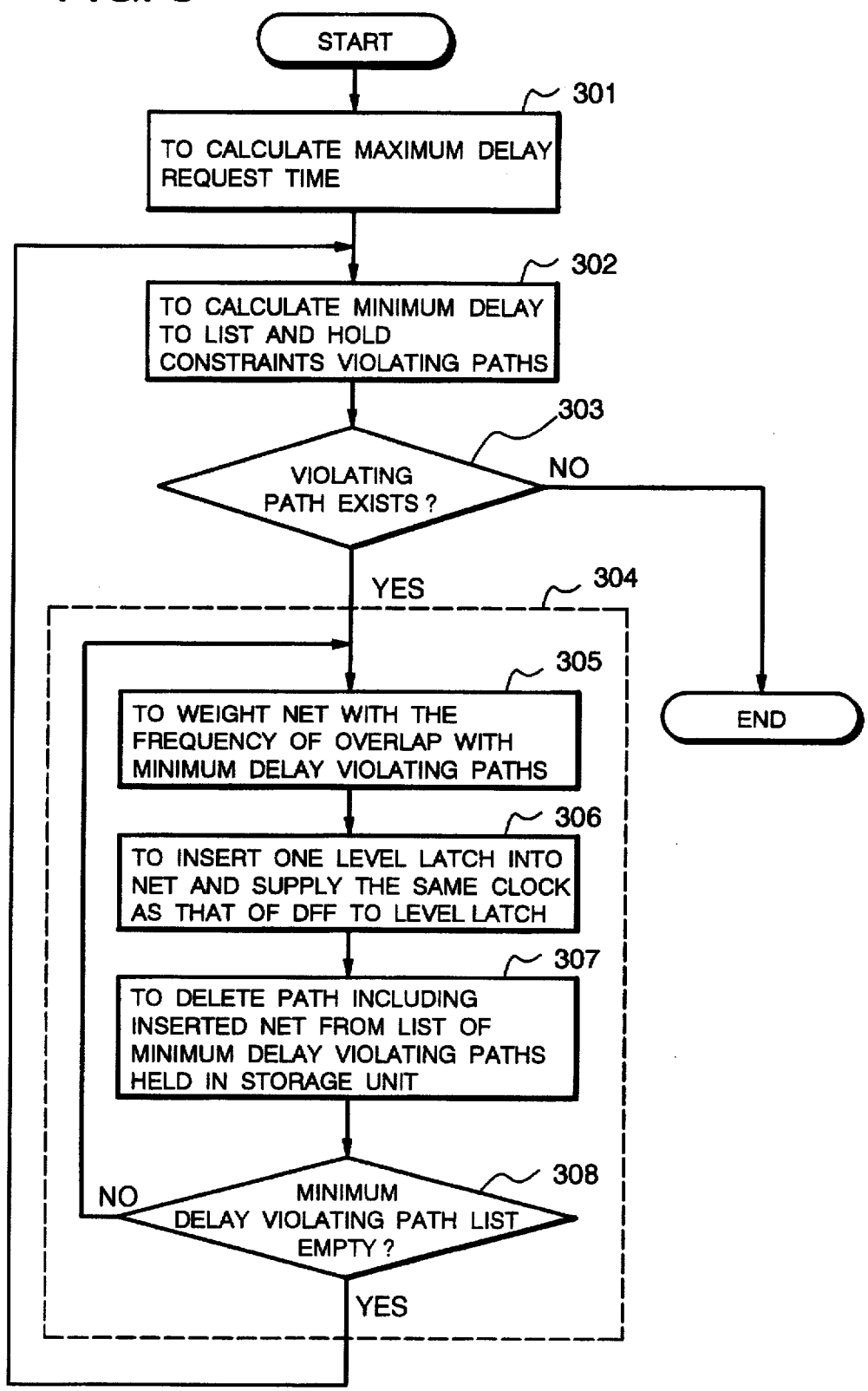
FIG. 3 is a flow chart showing operation of the delay optimizing method according to a first embodiment of the present invention.

Next, description will be made of a delay optimizing method according to the above-described first embodiment of the present invention by which minimum delay is compensated for by the insertion of a level latch. FIG. 3 is a flow chart showing operation of the delay optimization processing according to the present embodiment.

It is premised here that a synchronous sequential circuit of one-phase clock is a target circuit, that a hold time of a DFF is shorter than a latch period of a level latch, that maximum delay optimization is already executed to fill a setup time and that the maximum slack has a margin equivalent to the latch passing delay. It is further assumed that a hold time and a setup time of the level latch itself are negligible.

First, maximum delay is calculated and maximum delay required time at each net is obtained by executing reverse calculate in the direction opposite to the signal propagation direction to hold the calculation results in the storage unit 70 (Step 301). Then, minimum delay is calculated and paths which violate the minimum delay constraints (minimum delay violating path) are listed and held in the storage unit 70 (Step 302). Here, calculation of the maximum delay and the minimum delay are to be conducted including a latch period and a passing time of the level latch.

Next, determination is made whether a minimum delay violating path exists or not, and if there is no violating path left, processing is completed. On the other hand, when a violating path exists, the routine proceeds to Step 304 to conduct a series of processing (Step 303). Step 304 is a series of processing for calculating an optimum level latch insertion position and includes four Steps 305 to 308.

First, a net in a circuit corresponding to a minimum delay violating path is weighted with the frequency of overlap of with minimum delay violating paths (Step 305). Then, one level latch is inserted into one selected net whose frequency of overlap is the highest, out of the nets satisfying the above-described expression (5), to supply the same clock as supplied to the DFF to the level latch (Step 306). Here, if the DFF is of a type to accept input data at a rise of the clock, an active-low level latch is used, while the DFF is of a type to accept input data at a fall of the clock, an active-high level latch is used. Then, the path including a route of the net in which the level latch is inserted is deleted from the list of the minimum delay violating paths in storage unit 70 (Step 307). After the foregoing processing at Steps 305 to 307 is executed with respect to all the paths in the list of the minimum delay violating paths, the routine returns to Step 302 to again conduct minimum delay calculation (Step 308).

Figure 4:
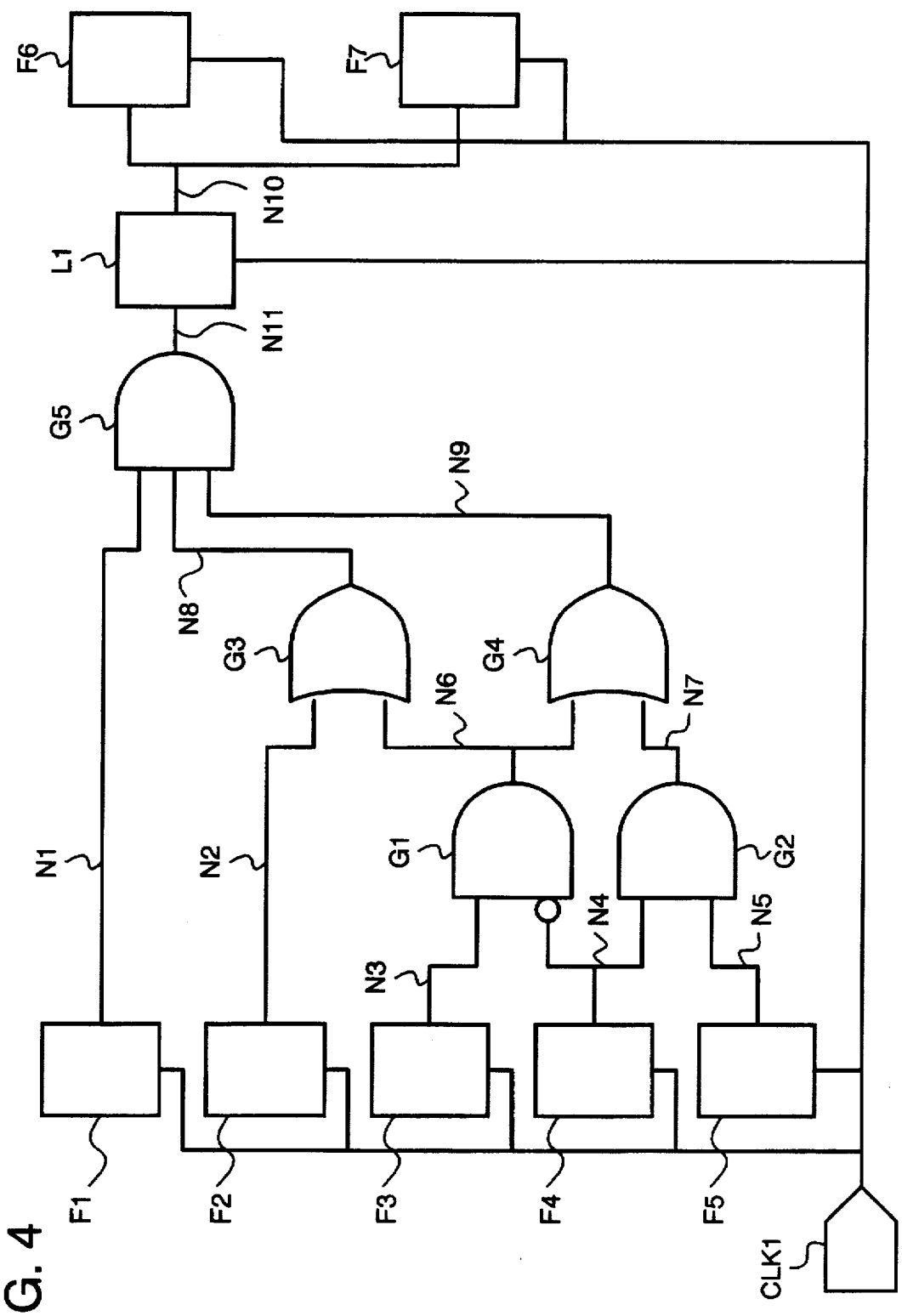
FIG. 4 is a circuit diagram showing an example of a structure of a synchronous sequential circuit which executes delay optimization processing according to the first embodiment.
Figure 5:
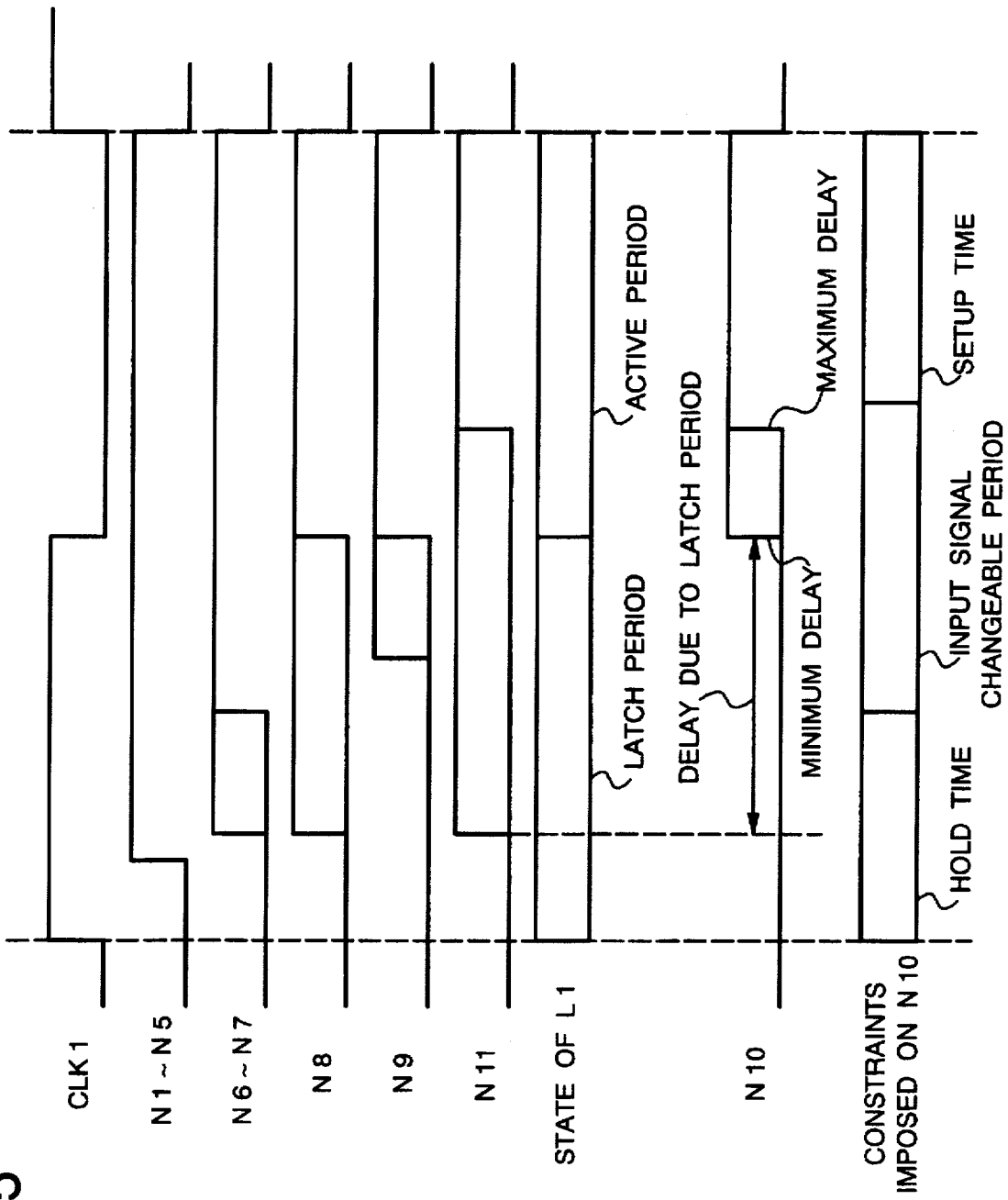
FIG. 5 is a timing chart showing operation of the synchronous sequential circuit illustrated in FIG. 4.
Figure 12:
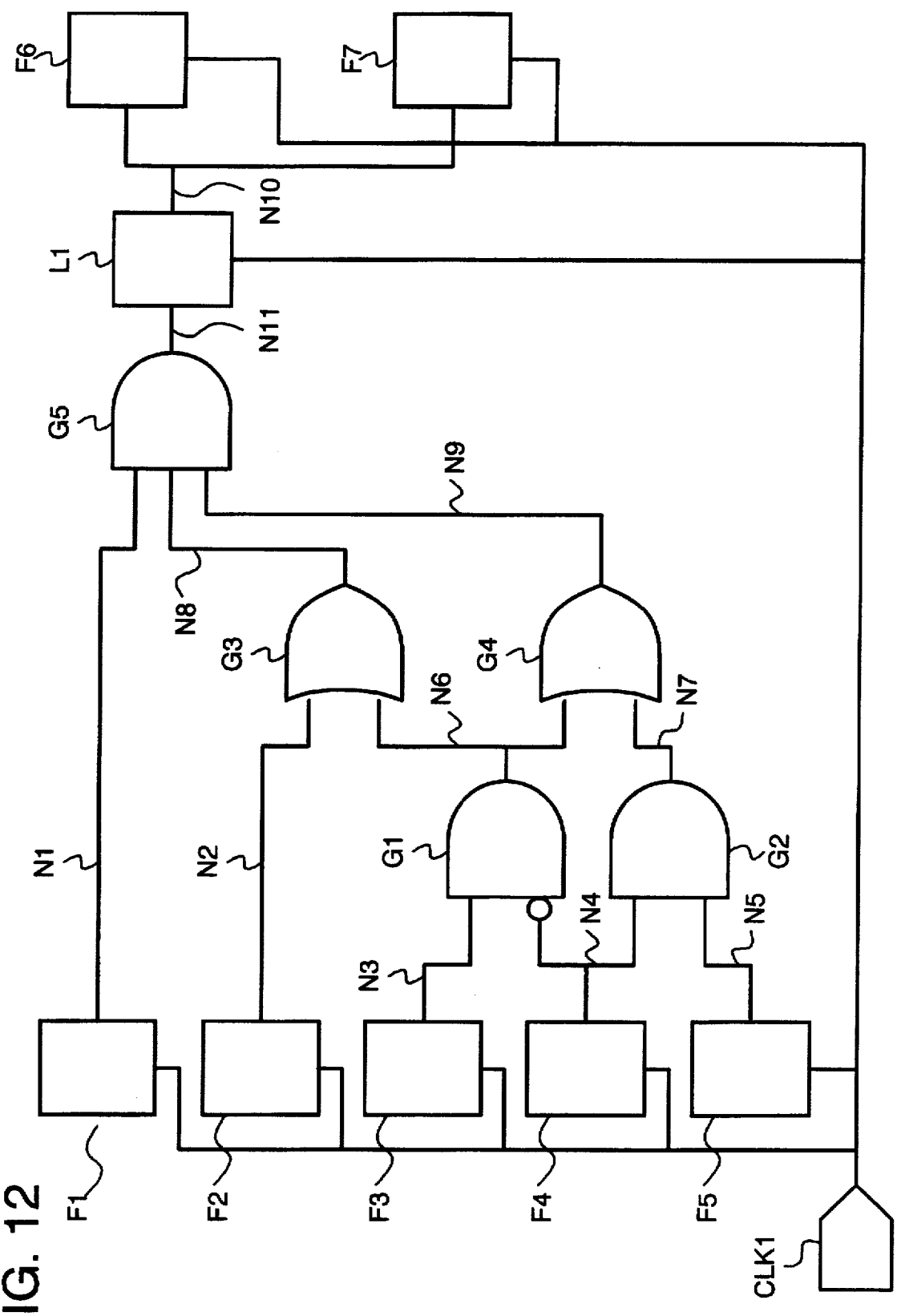
FIG. 12 is a circuit diagram showing an example of a synchronous sequential circuit including a path violating minimum delay constraints.
Figure 13:
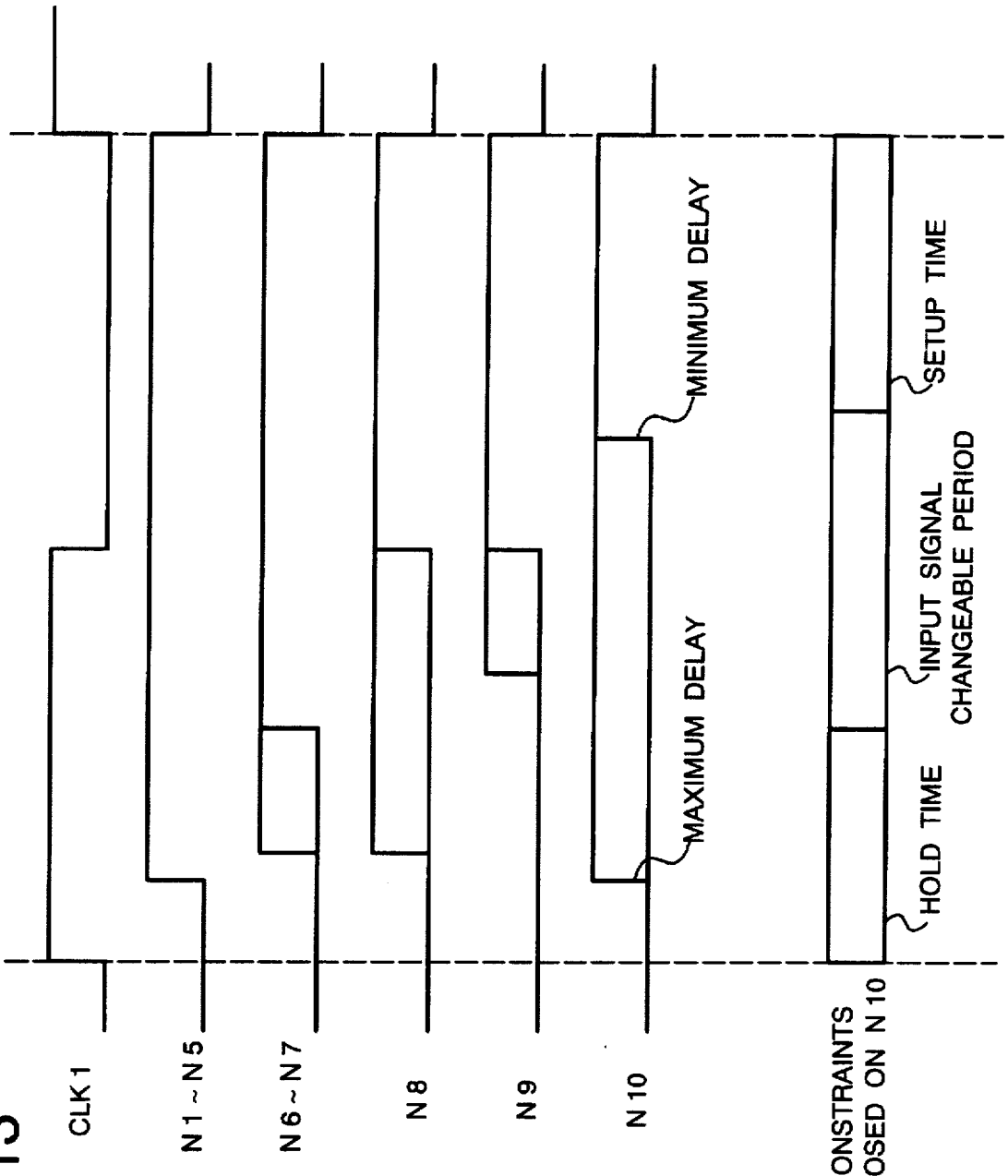
FIG. 13 is a timing chart showing operation of the synchronous sequential circuit illustrated in FIG. 12.
Figure 14:
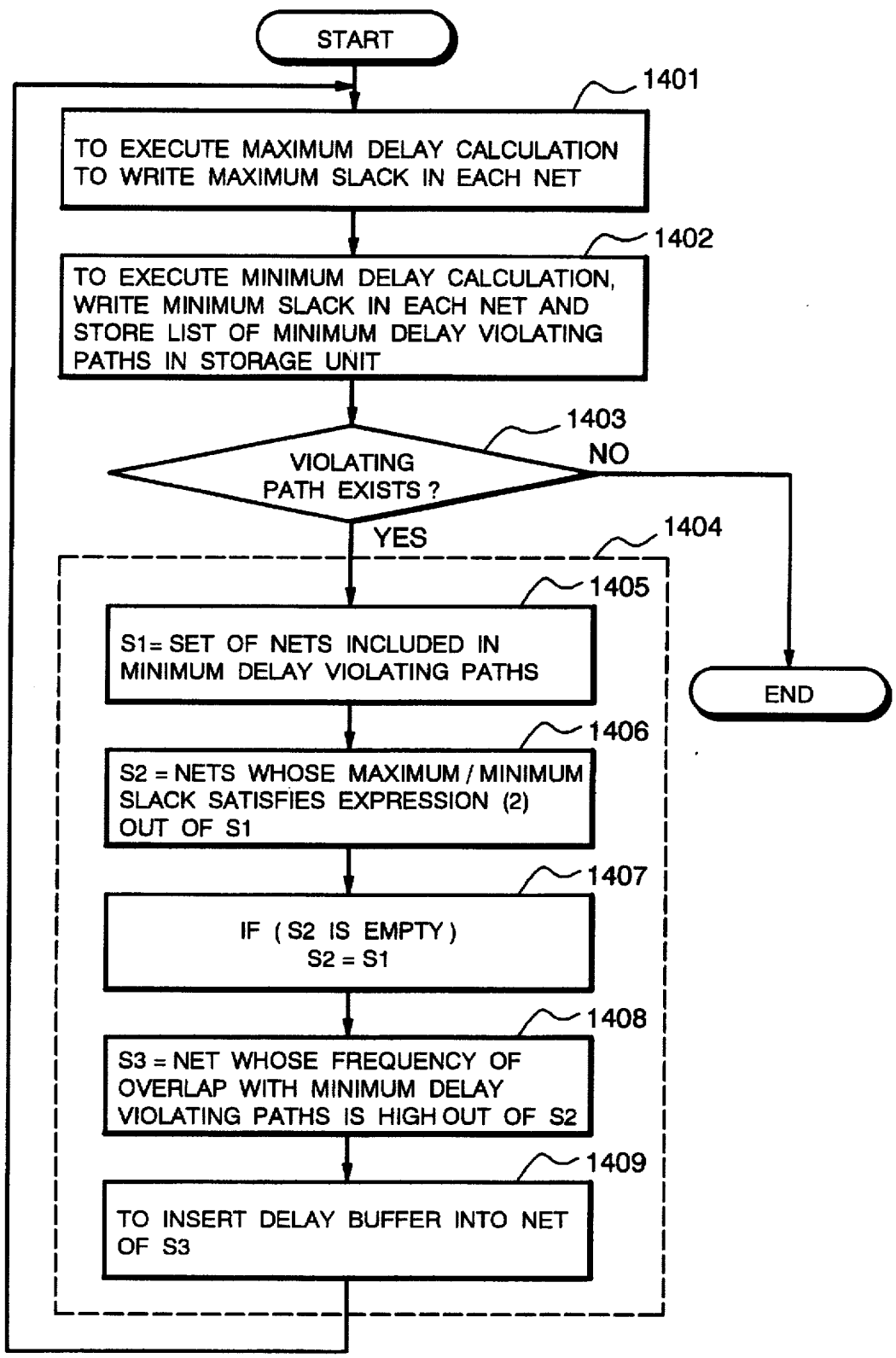
FIG. 14 is a flow chart showing a conventional delay optimizing method.
Figure 15:
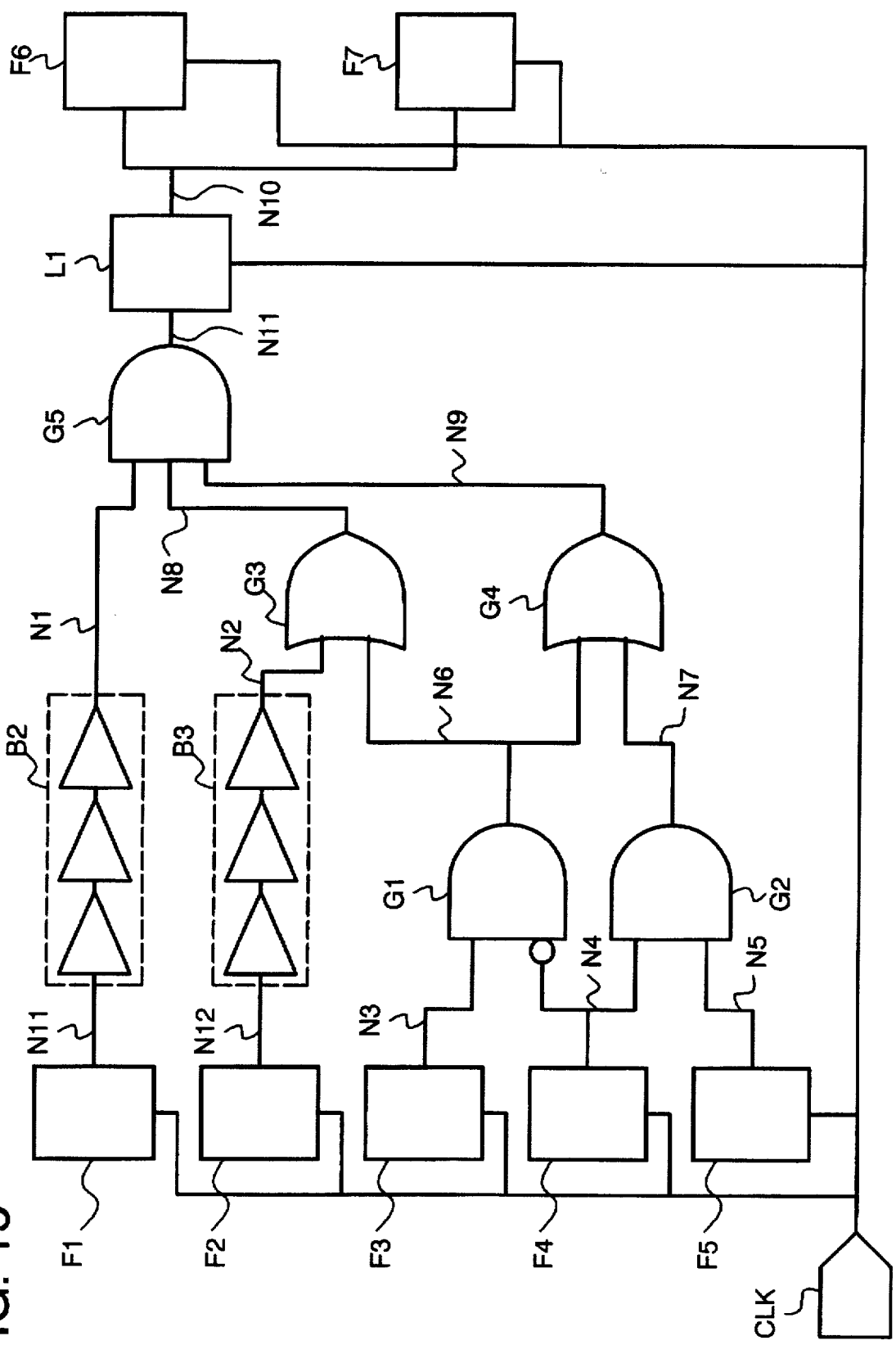
FIG. 15 is a circuit diagram showing an example of a structure of a synchronous sequential circuit which executes conventional delay optimization processing.

FIG. 4 is a circuit diagram showing a circuit obtained by executing the first embodiment with respect to the circuit of FIG. 12 described in DESCRIPTION OF THE RELATED ART, while FIG. 5 is a timing chart showing operation of the circuit shown in FIG. 4. As illustrated in FIG. 5, the minimum delay and the maximum delay both satisfy delay constraints as a result of insertion of the level latch L1. Here, an LSI layout pattern area of one level latch is set to be 6 units. As is illustrated in FIG. 4, inserted is one level latch and an increase in the LSI layout pattern area is 6 units accordingly. This increase in a layout pattern area is half that, 12 units, of a layout pattern area in a conventional delay optimizing method in which a delay buffer is inserted.

(Second Embodiment)

Second embodiment of the present invention will be described. The present embodiment, as well as the above-described first embodiment, is implemented by the logic synthesis device of FIG. 1 and executed as minimum delay optimization processing (Step 207) in the logic synthesis processing shown in FIG. 2.

Figure 6:
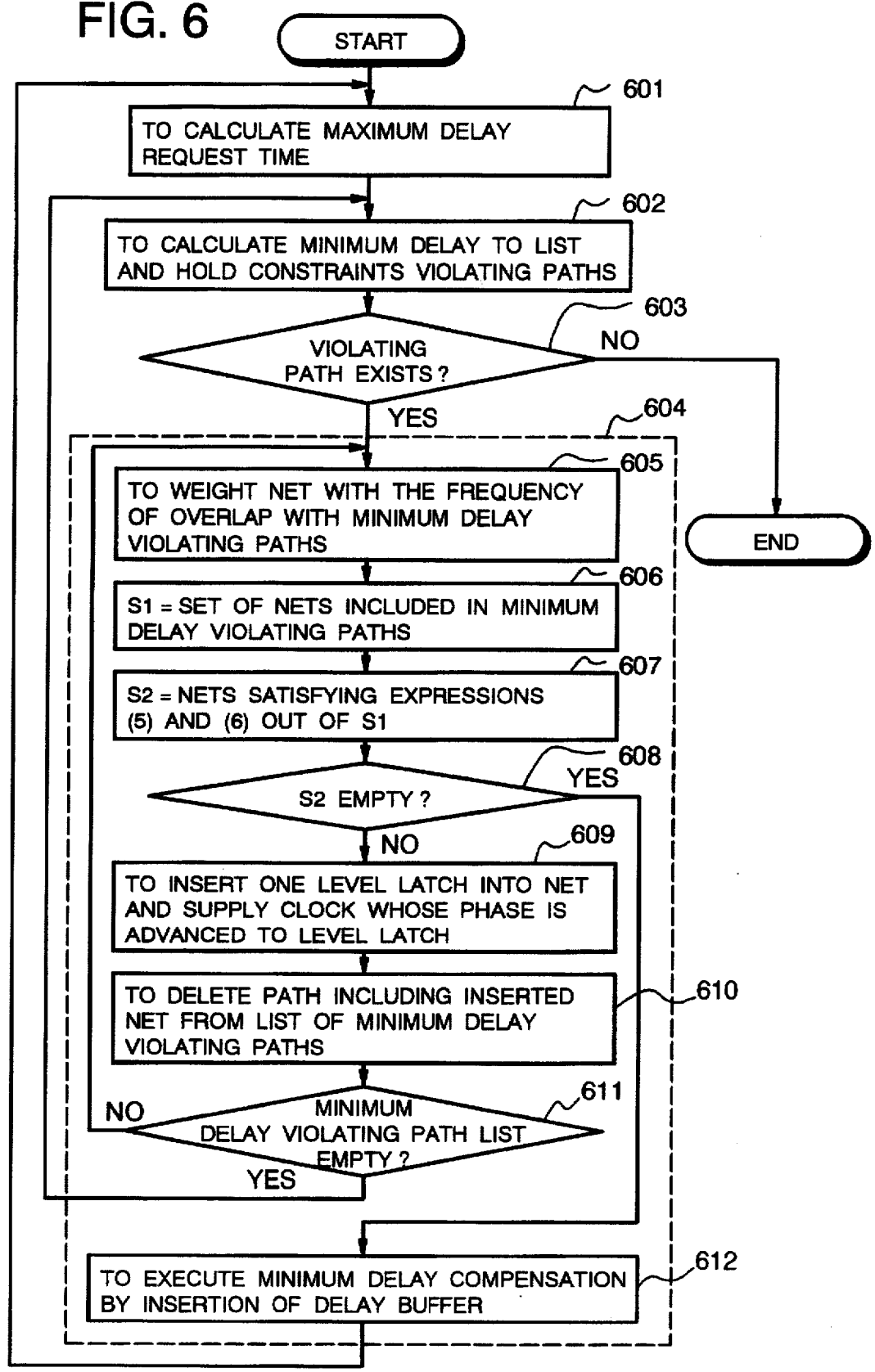
FIG. 6 is a flow chart showing operation of a delay optimizing method according to a second embodiment of the present invention.
Figure 7:
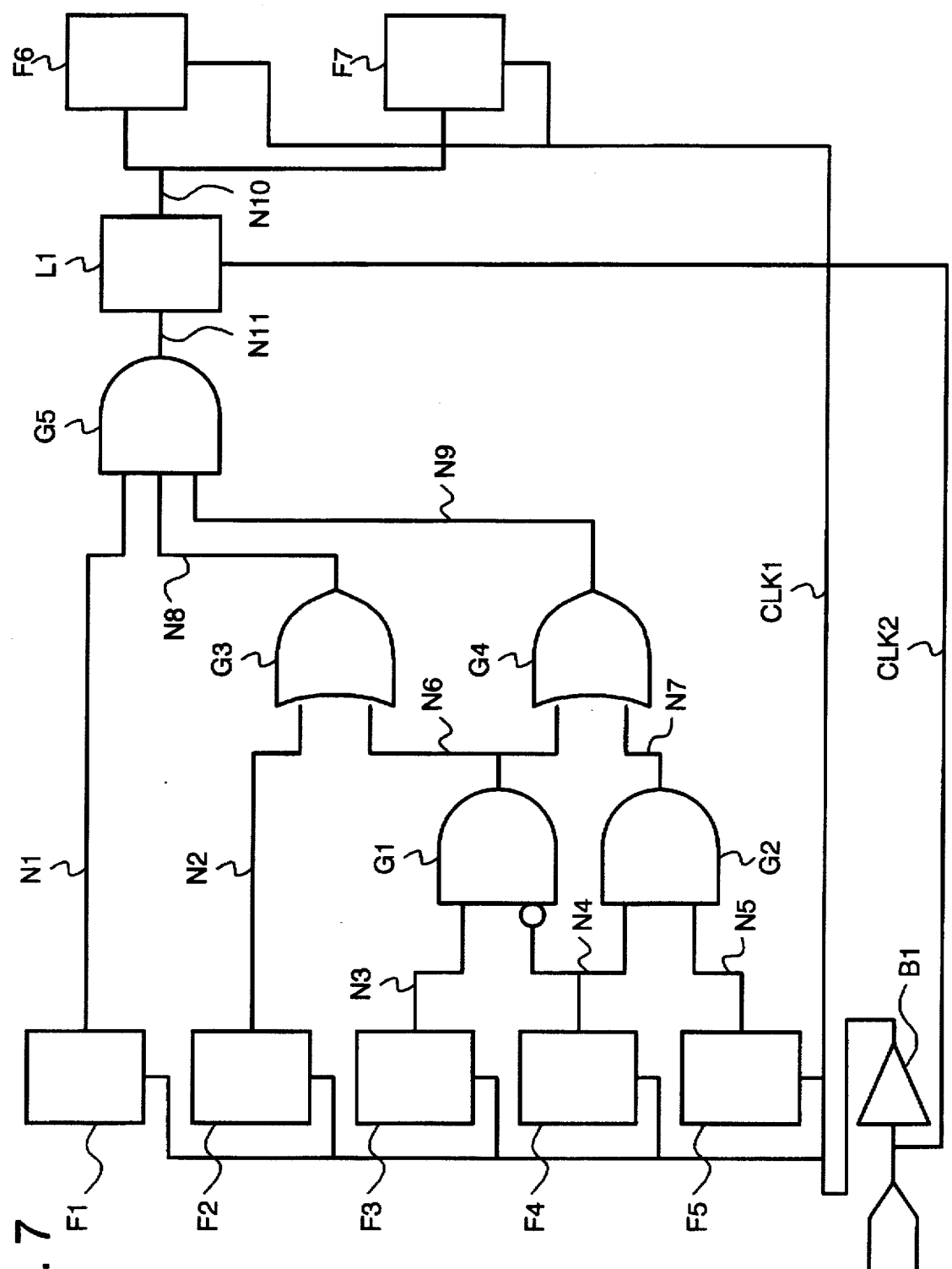
FIG. 7 is a circuit diagram showing an example of a structure of a synchronous sequential circuit which executes delay optimization processing according to the second embodiment.
Figure 8:
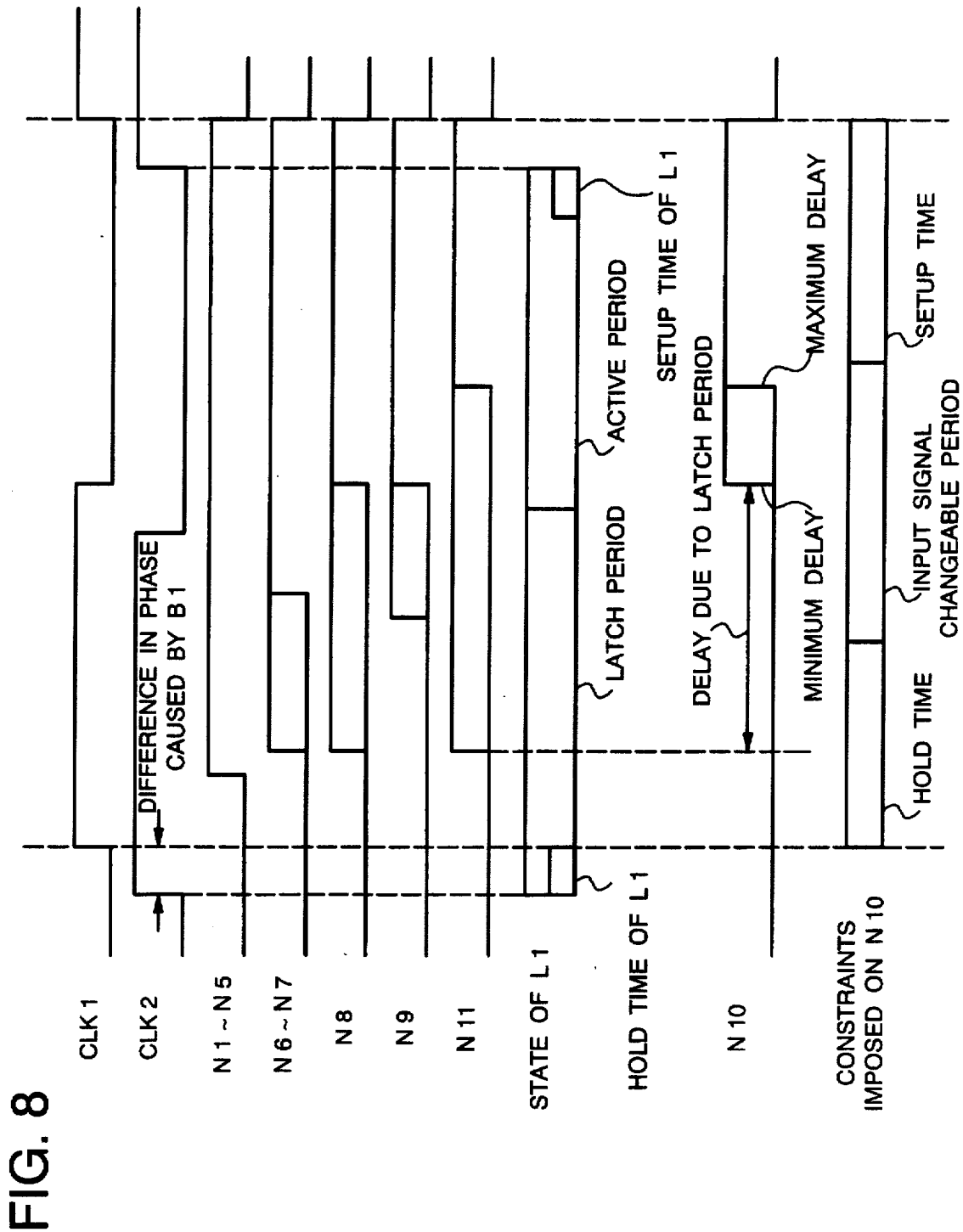
FIG. 8 is a timing chart showing operation of the synchronous sequential circuit illustrated in FIG. 7.

FIG. 6 is a flow chart showing operation of the second embodiment. FIG. 7 is a circuit diagram of a synchronous sequential circuit to which the second embodiment is applied, while FIG. 8 is a timing chart showing operation of the circuit.

The second embodiment is a method applicable to a case where a hold time and a setup time of a level latch itself are too long to be ignored in minimum delay compensation processing by the same synchronous sequential circuit as that of the above first embodiment and characterized in correcting a clock to be supplied to a level latch based on the determination of a net in which a level latch can be inserted in combination with the determination of the expression (6) to automatically select and execute compensation by the insertion of a delay buffer for a path whose compensation by a level latch is impossible.

First, maximum delay is calculated and maximum delay required time at each net is obtained by conducting reverse calculation in the direction opposite to the signal propagation direction to hold the calculation results in the storage unit 70 (Step 601). Then, minimum delay is calculated and paths which violate the minimum delay constraints (minimum delay violating paths) are listed and held in the storage unit 70 (Step 602). Here, the maximum delay and the minimum delay are to be conducted including a latch period and a passing time of the level latch.

Next, determination is made whether there exists a minimum delay violating path or not and if there is no such a path, processing is completed. On the other hand, when there exists a minimum delay violating path, the routine proceeds to Step 604 to conduct a series of processing (Step 603). Step 604 is a series of processing for calculating an optimum level latch insertion position and includes eight Steps 605 to 612.

First, a net in a circuit corresponding to a minimum delay violating path is weighed with the frequency of overlap with a minimum delay violating paths (Step 605). Then, a group of nets included in the minimum delay violating paths is selected to be a set S1 (Step 606). Of the set S1, a group of nets satisfying the expressions (5) and (6) is selected to be a set S2 (Step 607). Here, if the set S2 is an empty set, determination is made that no minimum delay compensation by a level latch is required, whereby the routine proceeds to Step 612 to conduct minimum delay compensation by a delay buffer (Step 608).

When the set S2 includes elements, one net whose frequency of overlap with minimum delay violating paths is the highest is selected out of the nets as the elements of the set S2, one level latch is inserted in the selected net and a clock whose phase is advanced of the clock supplied to a DFF by a hold time of the level latch is supplied to the level latch (Steps 608, 609). Then, a path including the net in which the level latch is inserted is deleted from the list of the minimum delay violating paths in the storage unit 70 (Step 610). After executing the foregoing processing at Steps 605 to 610 with respect to all the minimum delay violating paths listed, the routine returns to Step 602 to again execute minimum delay calculation (Step 611).

Thereafter, the remaining minimum delay violating paths are compensated for minimum delay by the insertion of a delay buffer and then the routine returns to Step 601 to again execute the processing beginning with the calculation of the maximum delay (Step 612).

FIG. 7 is a circuit diagram showing a circuit obtained by executing the second embodiment with respect to the circuit of FIG. 12 described in DESCRIPTION OF THE RELATED ART, while FIG. 8 is a timing chart of the circuit. As is illustrated in FIG. 8, the minimum delay and the maximum delay both satisfy delay constraints as a result of the insertion of the level latch L1. As is illustrated in FIG. 7, the clock CLK1 has one delay buffer Ba inserted therein which serves to make the clock to be supplied to the level latch and that to be supplied to the DFF be out of phase with each other. The increase in the LSI layout pattern area is therefore 8 units, which increase is small enough as compared with that of a conventional delay optimizing method involving insertion of a delay buffer.

(Third Embodiment)

Description will be given of the third embodiment of the present invention. The present embodiment is realized by adding, to the first and second embodiments, processing for adding a circuit for changing a duty ratio of a clock to be supplied to a level latch such that minimum delay can be compensated for by the insertion of a level latch when the minimum delay required time is longer than a latch period at the time of execution of the above-described processing of the first and second embodiments for inserting a level latch into a predetermined net to supply a predetermined clock (See FIG. 3, Step 306 and FIG. 6, Step 609). Since operation of a DFF is independent of a duty ratio of the clock, the clock for the level latch and that for DFF may be the same or different.

Figure 9:
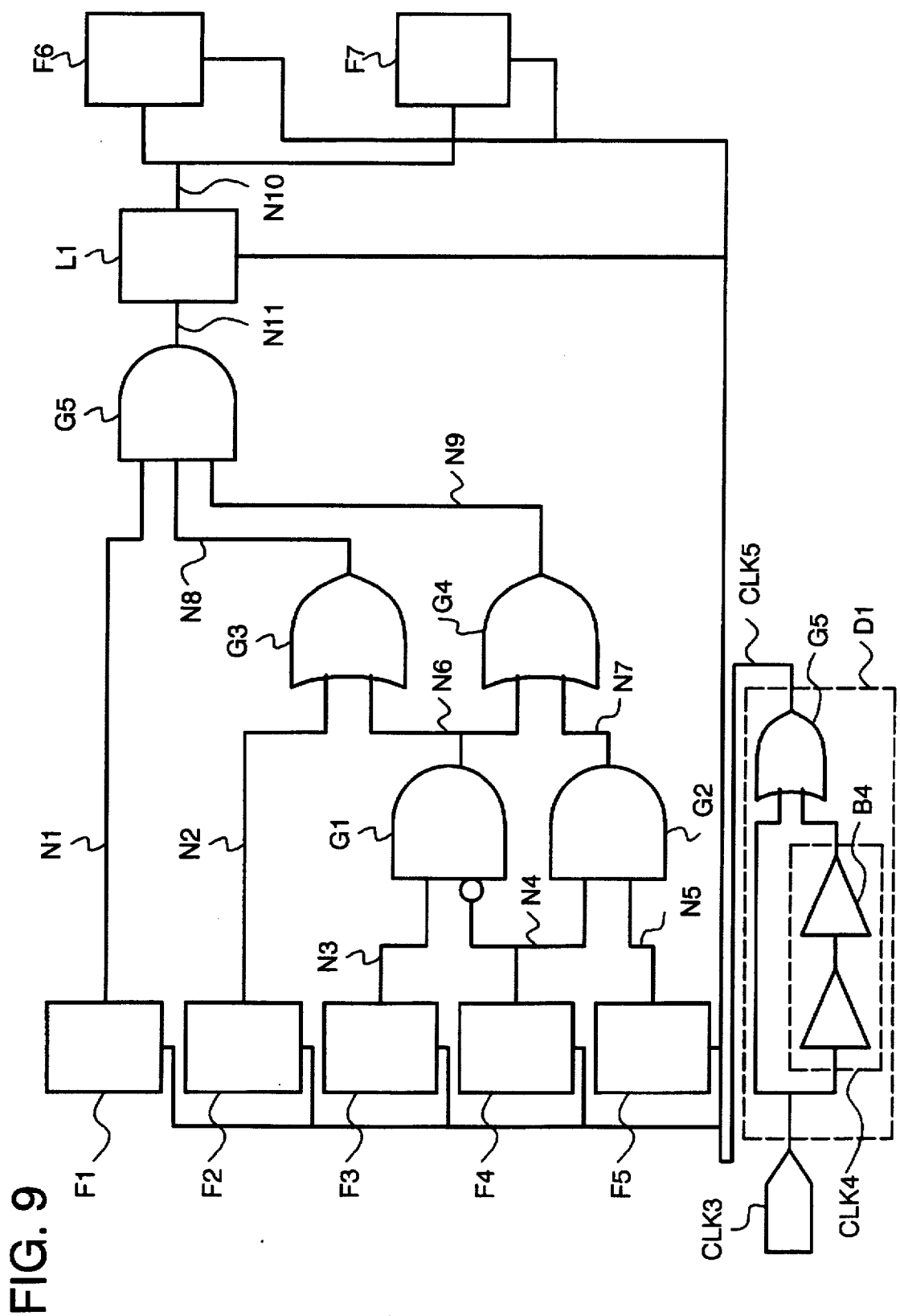
FIG. 9 is a circuit diagram showing an example of a structure of a synchronous sequential circuit which executes delay optimization processing according to a third embodiment of the present invention.
Figure 10:
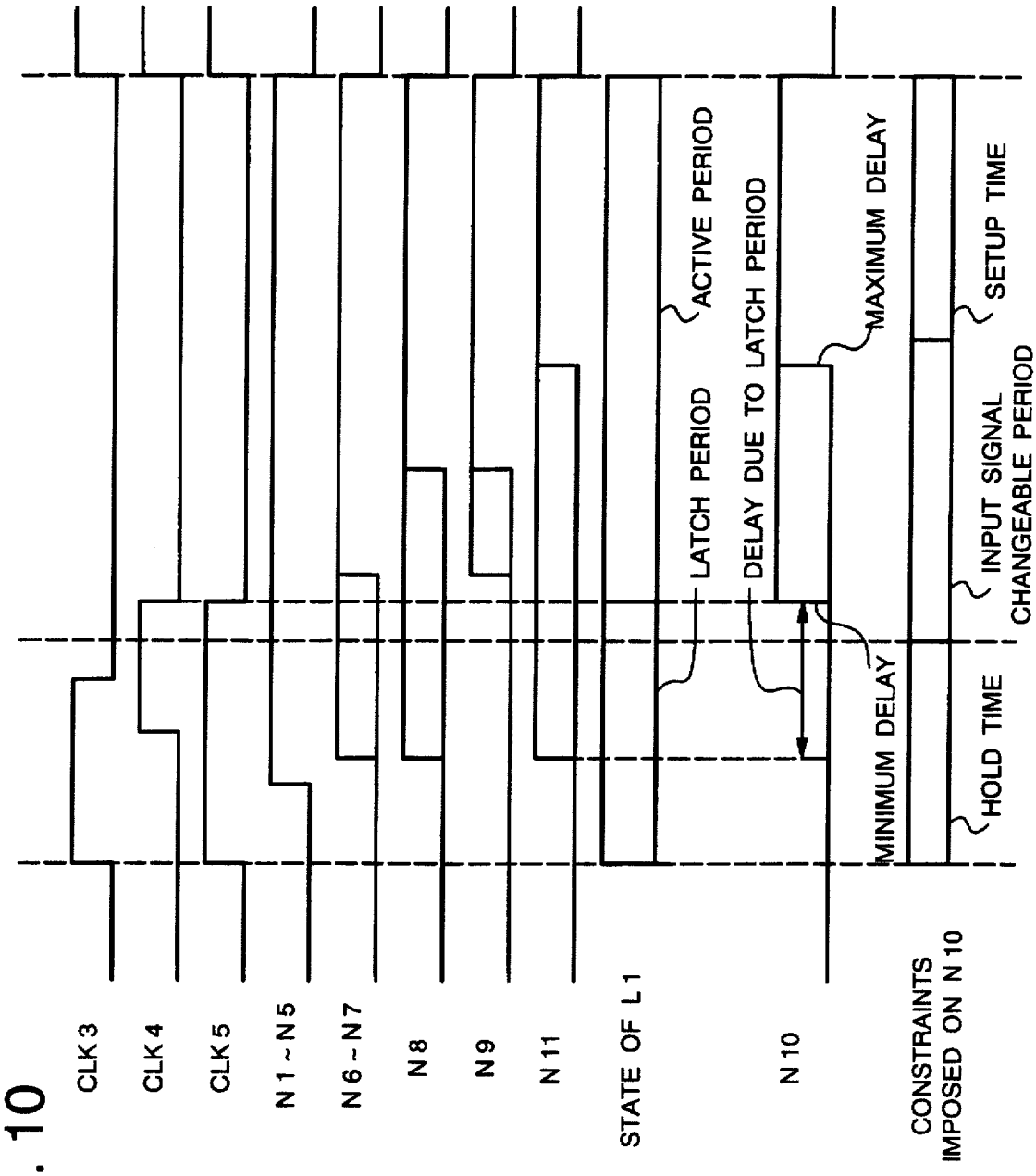
FIG. 10 is a timing chart showing operation of a synchronous sequential circuit illustrated in FIG. 9.

FIG. 9 is a circuit diagram of a synchronous sequential circuit to which the third embodiment of the present invention is applied, while FIG. 10 is a timing chart showing operation of the circuit.

As shown in FIG. 10, when an original clock CLK3 is at a high level, that is, when the latch period is shorter than the hold time of DFF, the latch period of a level latch L1 is extended by adding a clock duty ratio converting circuit D1. As a simple example, the CLK3 is ORed (G5) with a CLK4, which is obtained by delaying the CLK3 by a delay buffer B4, to generate a CLK5, as illustrated in the figure.

(Fourth Embodiment)

The fourth embodiment of the present invention will be described. The present embodiment, as well as the above-described first and second embodiments, is implemented by the logic synthesis device of FIG. 1 and executed as the minimum delay optimization processing (Step 207) in the logic synthesis processing shown in FIG. 2.

Figure 11:
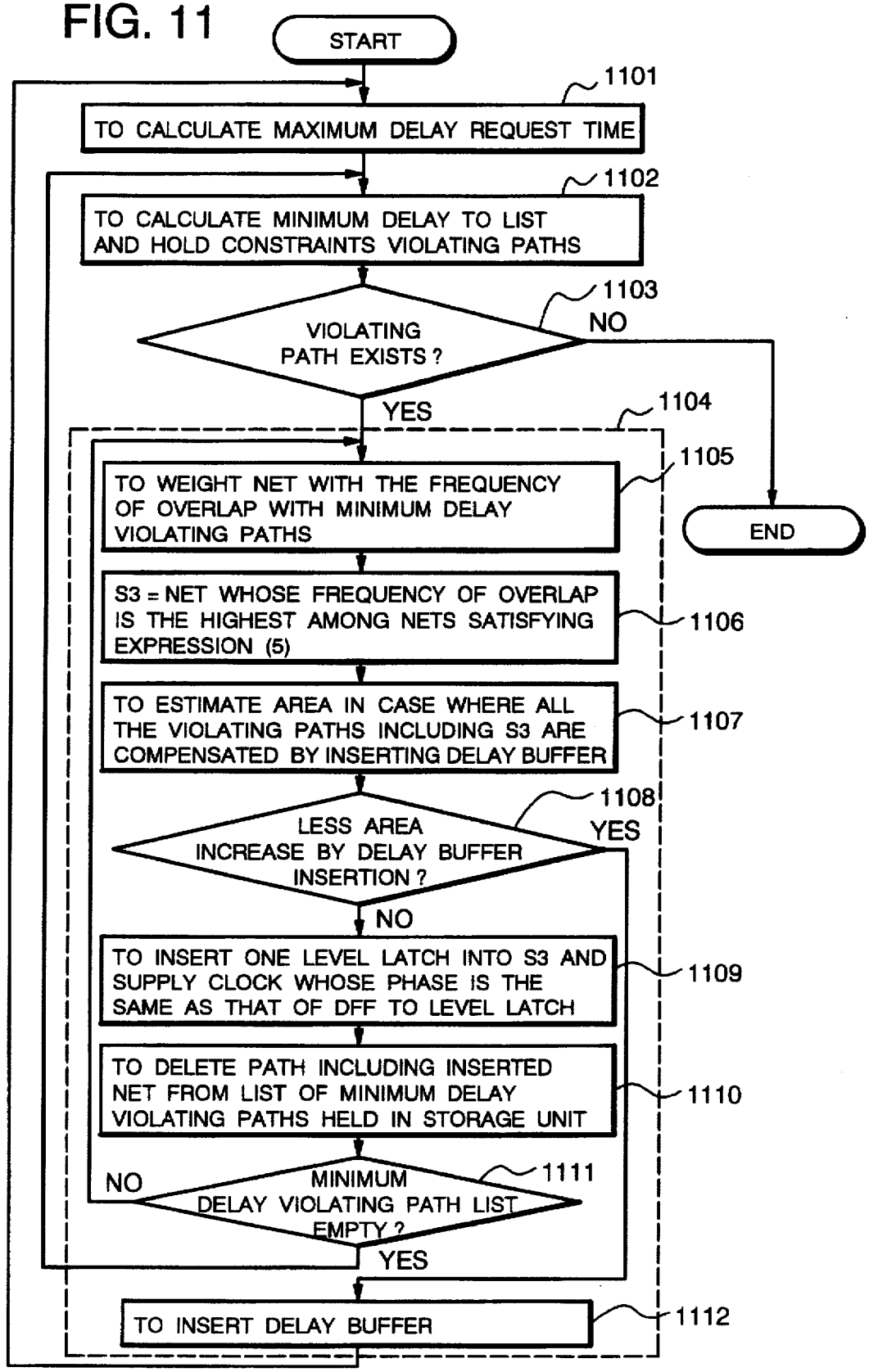
FIG. 11 is a flow chart showing operation of a delay optimizing method according to a fourth embodiment of the present invention.

FIG. 11 is a flow chart showing operation of the fourth embodiment.

In the fourth embodiment, LSI layout pattern areas in a case of minimum delay compensation by the insertion of a level latch and in a case of minimum delay compensation by the insertion of a delay buffer are compared with each other to selectively execute either compensation method involving less area increase.

As shown in the figure, the operation, beginning with a series of processing for calculating an optimum level latch insertion position and ending with weighing nets in the circuit corresponding to minimum delay violating paths with the frequency of overlap with minimum delay violating paths (Steps 1101–1105) are the same as the operation of the first embodiment shown in FIG. 3 (Step 301–305) and the operation of the second embodiment (Steps 601–605) shown in FIG. 6. Thereafter, out of the nets satisfying the above expression (5), one net whose frequency of overlap with minimum delay violating paths is the highest is selected to be a set S3 of level latch insertion positions (Step 1106) and an increase in an LSI layout pattern area is estimated in a case where minimum delay compensation by the insertion of a delay buffer is executed with respect to all the minimum delay violating paths including a net corresponding to the insertion position S3 (Step 1107). Then, if the LSI layout pattern area increase is smaller than that in a case where minimum delay compensation is conducted by the insertion of a level latch, a delay buffer is inserted (Steps 1108, 1112). On the other hand, if the LSI layout pattern area increase in a case where a delay buffer is inserted is larger than that in a case where a level latch is inserted, minimum delay compensation by the insertion of a level latch is executed (Steps 1108, 1109, 1110, 1111). Here, the procedure of the minimum delay compensation by the insertion of a level latch is the same as the operation (Steps 306–308) in the first embodiment and that in the second embodiment as shown in FIG. 6 (Steps 609–611).

As described in the foregoing, the present invention employs a level latch as a delay element. Since level latch serves to temporarily maintain a signal state in synchronization with a clock, insertion of a level latch causes no delay in a circuit as a whole. Therefore, no delay occurs in practice although as if delay were generated by temporarily maintaining a signal state at a desired part. As a result, no change occurs in a maximum delay time of the circuit as a whole by the insertion of a plurality of level latches.

It is therefore unnecessary to calculate maximum delay every time a level latch is inserted and a processing time is reduced accordingly. In other words, minimum delay calculation needs to be conducted once at first and no particular consideration is necessary thereafter for determining a latch insertion position. Because the present invention requires calculation of minimum delays only, it enables reduction of a processing time down to less than 50 percent of that by the method in which a delay buffer is inserted while calculating both maximum and minimum delays.

In addition, since no consideration needs to be given to a maximum delay, nets which overlap with maximum delay violating paths or nets in which insertion of a delay buffer causes generation of another maximum delay violating path can be candidates for latch insertion positions, thereby reducing the number of latch insertion positions required. In other words, it is possible to avoid such a situation that insertion of a delay element into a circuit leads to addition of certain processing to other part of the circuit. Increase in an LSI layout pattern area can be minimized as a result.

Moreover, even when a user will set a larger margin of a hold time, delay constraints can be satisfied within a latch period of the level latch as long as one level latch is inserted into a path.

In addition, minimum delay compensation is possible for a multi-phase, not one-phase, synchronous sequential circuit by generating a clock signal whose phase or duty ratio is converted, from a clock supplied to a DFF terminating a path in which a level latch is inserted, and by supplying the signal to the level latch.

Also as compared with a widely used conventional two-phase master/slave circuit in which paired DFFs or level latches connected in series are originally provided and therefore the number of DFFs or level latches is twice that required in a common designing method, the present invention, in which a level latch insertion position is not limited to that immediately preceding DFF, enables reduction in the number of level latches to be inserted down to the number of DFFS by finding a better insertion position, thereby saving an LSI layout pattern area.

As described with respect to the above embodiments, delay buffer can be used in combination for a part of a circuit where insertion of a level latch is a problem, for example, because a hold time or a setup time of the level latch itself is not negligible.

Longer minimum delay required time than a latch time of a level latch can be coped with by executing such processing as changing a duty ratio of a clock.

Moreover, it is possible to automatically and selectively execute either a delay optimization method employing insertion of a level latch or that employing insertion of a delay buffer whose circuit area increase calculated in advance is smaller.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A delay optimizing method characterized in that a delay time is added to a signal path which is short in delay time to violate minimum delay constraints in a synchronous sequential circuit so as to compensate for a minimum delay; comprising the steps of:

a first step of detecting a signal path violating said minimum delay constraints, a second step of calculating the frequency of overlap of each output terminal included in said synchronous sequential circuit with signal paths violating the minimum delay constraints, and a third step of inserting a level latch in a signal path in the descending order of said frequency of overlap such that an LSI layout pattern area of said synchronous sequential circuit is minimized.

2. The delay optimizing method according to claim 1, wherein said third step of inserting a level latch into a signal path includes a step of inserting an active-low level latch into a flip-flop which accepts input data at a rise of the clock and an active-high level latch into a flip-flop which accepts input data at a fall of the clock according to the edge trigger polarity of the clock in a flip-flop in said synchronous sequential circuit.

3. The delay optimizing method according to claim 1, wherein said third step of inserting a level latch into a signal path includes a step of inserting a level latch into a signal path in the descending order of said frequency of overlap, out of the signal paths in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below:

$$TL+TT<R(i).$$

4. The delay optimizing method according to claim 1, wherein said third step of inserting a level latch in a signal path includes a step of adding a circuit for changing a duty ratio of a clock to be supplied to said inserted level latch when a minimum delay required time is longer than a latch period.

5. A delay optimizing method characterized in that a delay time is added to a signal path which is short in delay time to violate minimum delay constraints in a synchronous sequential circuit so as to compensate for a minimum delay, comprising the steps of:

a first step of detecting a signal path violating said minimum delay constraints, a second step of calculating the frequency of overlap of each output terminal included in said synchronous sequential circuit with signal paths violating the minimum delay constraints, and a third step of selectively inserting a delay buffer or a level latch as a delay element into a signal path in the descending order of said frequency of overlap such that an LSI layout pattern area of said synchronous sequential circuit is minimized.

6. The delay optimizing method according to claim 5, wherein said third step of inserting a level latch in a signal path includes a step of inserting an active-low level latch into a flip-flop which accepts input data at a rise of the clock and an active-high level latch into a flip-flop which accepts input data at a fall of the clock according to the edge trigger polarity of the clock in a flip-flop in said synchronous sequential circuit.

7. The delay optimizing method according to claim 5, wherein said third step of inserting a level latch into a signal path includes a step of inserting a level latch into a signal path in the descending order of said frequency of overlap, out of the signal paths in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below:

$$TL+TT<R(i).$$

8. The delay optimizing method according to claim 5, wherein said third step of inserting a level latch in a signal path includes a step of adding a circuit for changing a duty ratio of a clock to be supplied to said inserted level latch when a minimum delay required time is longer than a latch period.

9. The delay optimizing method according to claim 5, wherein said third step of inserting a level latch into a signal path includes the steps of:

a fourth step of selecting a signal path in which a time TL when a clock supplied to a logic element in said synchronous sequential circuit is at a high level, a time TT required for a signal to pass through said inserted level latch and a maximum required time R(i) which is a value of subtraction of a setup time from a cycle of said clock satisfy the expression set forth below;

$$TL+TT<R(i), \text{ and}$$

a fifth step of comparing a maximum delay and a maximum required time of a signal path selected by said fourth step, inserting a level latch into a signal path in the descending order of said frequency of overlap when the maximum delay is smaller and otherwise inserting a delay buffer into the signal path.

10. The delay optimizing method according to claim 9, wherein said third step of inserting a level latch in a signal path includes a step of adding a circuit for changing a duty ratio of a clock to be supplied to said inserted level latch when a minimum delay required time is longer than a latch period.

11. The delay optimizing method according to claim 5, wherein said third step of inserting a level latch into a signal path includes a step of comparing, with respect to signal paths into which said delay element is to be inserted, an increase in area of a circuit as a whole in a case where a delay buffer is inserted and an increase in area of a circuit as a whole in a case where a level latch is inserted and inserting a delay buffer into the signal path when the circuit area increase by the insertion of a delay buffer is smaller and a level latch into the signal path when the circuit area increase by the insertion of a level latch is smaller.

* * * * *